(12) United States Patent
Trimmer (10) Patent No.: US 8,564,333 B2
(45) Date of Patent: Oct. 22, 2013

(54) DETECTION OF BAD CLOCK CONDITIONS (75) Inventor: Mark Trimmer, Buckinghamshire (GB)

(73) Assignee: STMicroelectronics Limited, Buckinghamshire (GB)

( * ) Notice: Subject to any disclaimer, the term of this patent is extended or adjusted under 35 U.S.C. 154(b) by 673 days.

(21) Appl. No.: 12/822,881

(22) Filed: Jun. 24, 2010

(65) Prior Publication Data

US 2010/0327913 A1 Dec. 30, 2010

(30) Foreign Application Priority Data

Jun. 25, 2009 (GB) .................................. 0911046.1

(51) Int. Cl.
*H03K 5/19* (2006.01)

(52) U.S. Cl.
USPC .......................................................... 327/20

(58) Field of Classification Search
USPC .......................................................... 327/20
See application file for complete search history.

(56) References Cited

U.S. PATENT DOCUMENTS 6,239,629 B1 * 5/2001 Erickson ...................... 327/141

* cited by examiner

*Primary Examiner* — Daniel Rojas
(74) *Attorney, Agent, or Firm* — Munck Wilson Mandala, LLP (57) ABSTRACT

There is provided a circuit and method for detecting a bad clock condition on a clock signal that includes sampling the value of the clock signal at a first plurality of time delays following a rising edge on the clock signal. This method also includes sampling the value of the clock signal at a second plurality of time delays following a falling edge on the clock signal.

20 Claims, 6 Drawing Sheets

DETECTION OF BAD CLOCK CONDITIONS

CROSS-REFERENCE TO RELATED APPLICATIONS

The present application is related to United Kingdom Patent Application No. 0911046.1, filed Jun. 25, 2009, entitled "DETECTION OF BAD CLOCK CONDITIONS". United Kingdom Patent Application No. 0911046.1 is assigned to the assignee of the present application and is hereby incorporated by reference into the present disclosure as if fully set forth herein. The present application hereby claims priority under 35 U.S.C. §119(a) to United Kingdom Patent Application No. 0911046.1.

TECHNICAL FIELD

This invention relates to the detection of bad clock conditions on a clock signal.

BACKGROUND

Processors in computer systems carrying out operations typically use a clock signal to regulate the timing of the operations. A clock signal has regularly timed transitions (at least one of rising or falling edges), such that operations can be carried out in the computer system in accordance with the timing of the transitions on the clock signal. In this way the frequency of the clock signal determines the frequency at which operations are performed in the computer system.

In some systems only rising edges of the clock signal are used to regulate the operations in the computer system. In such systems, the relative timing of the falling edges of the clock signal does not affect the timing of the operations in the computer system, provided that the rising edges are regularly timed. Therefore, clock signals with various mark-space ratios can be used. Similarly, in other systems only falling edges of the clock signal are used to regulate the operations in the computer system.

A chip in a computer system might malfunction in various ways if the clock signal is significantly slowed or stopped, even temporarily. In developing security measures, the inventor is aware that, for example, the security of data stored on a set-top-box chip may be compromised if the clock signal is significantly slowed or stopped. Security features on such set-top-box chips, or similar chips, may be compromised by significantly slowing down or stopping a clock which provides a clock signal to the chip. Detecting this condition provides a defense against such compromises to security features of chips.

It is an aim of the present invention to provide a method and circuit for detecting when the clock signal has been significantly slowed or stopped, allowing remedial action to be taken to prevent malfunction of the chip.

SUMMARY

In a first aspect of the invention there is provided a method of detecting a bad clock condition on a clock signal, the method comprising: sampling the value of the clock signal at a first plurality of time delays following a rising edge on the clock signal, such that a respective first plurality of samples are produced; determining whether all of the first plurality of samples have a first logic state; sampling the value of the clock signal at a second plurality of time delays following a falling edge on the clock signal, such that a respective second plurality of samples are produced; determining whether all of the second plurality of samples have a second logic state; and determining that the bad clock condition exists on the clock signal if at least one of the following conditions is met: it is determined that all of the first plurality of samples have the first logic state, or it is determined that all of the second plurality of samples have the second logic state.

In a second aspect of the invention there is provided a circuit for detecting a bad clock condition on a clock signal, the circuit comprising: first sampling means for sampling the value of the clock signal at a first plurality of time delays following a rising edge on the clock signal, such that a respective first plurality of samples are produced; first determining means for determining whether all of the first plurality of samples have a first logic state; second sampling means for sampling the value of the clock signal at a second plurality of time delays following a falling edge on the clock signal, such that a respective second plurality of samples are produced; second determining means for determining whether all of the second plurality of samples have a second logic state; and third determining means for determining that the bad clock condition exists on the clock signal if at least one of the following conditions is met: it is determined that all of the first plurality of samples have the first logic state, or it is determined that all of the second plurality of samples have the second logic state.

There is also provided a computer system for processing data using a clock signal, comprising a circuit as described above for detecting a bad clock condition on the clock signal.

The method and circuit described above detects when a clock signal has slowed significantly or stopped, allowing remedial action to be taken. After rising and falling edges it is checked that there have been further subsequent edges on the clock signal within a particular time period. The output of the circuit may set a sticky bit if no transition occurs on the clock signal for longer than a predetermined time.

The inventor has realised that it would be useful to have a dynamic check on the integrity of an external crystal oscillator input clock to set-top-box chips. The method and circuit of the present invention helps to secure the secret content of such chips.

Other technical features may be readily apparent to one skilled in the art from the following figures, descriptions and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

Figure 1:
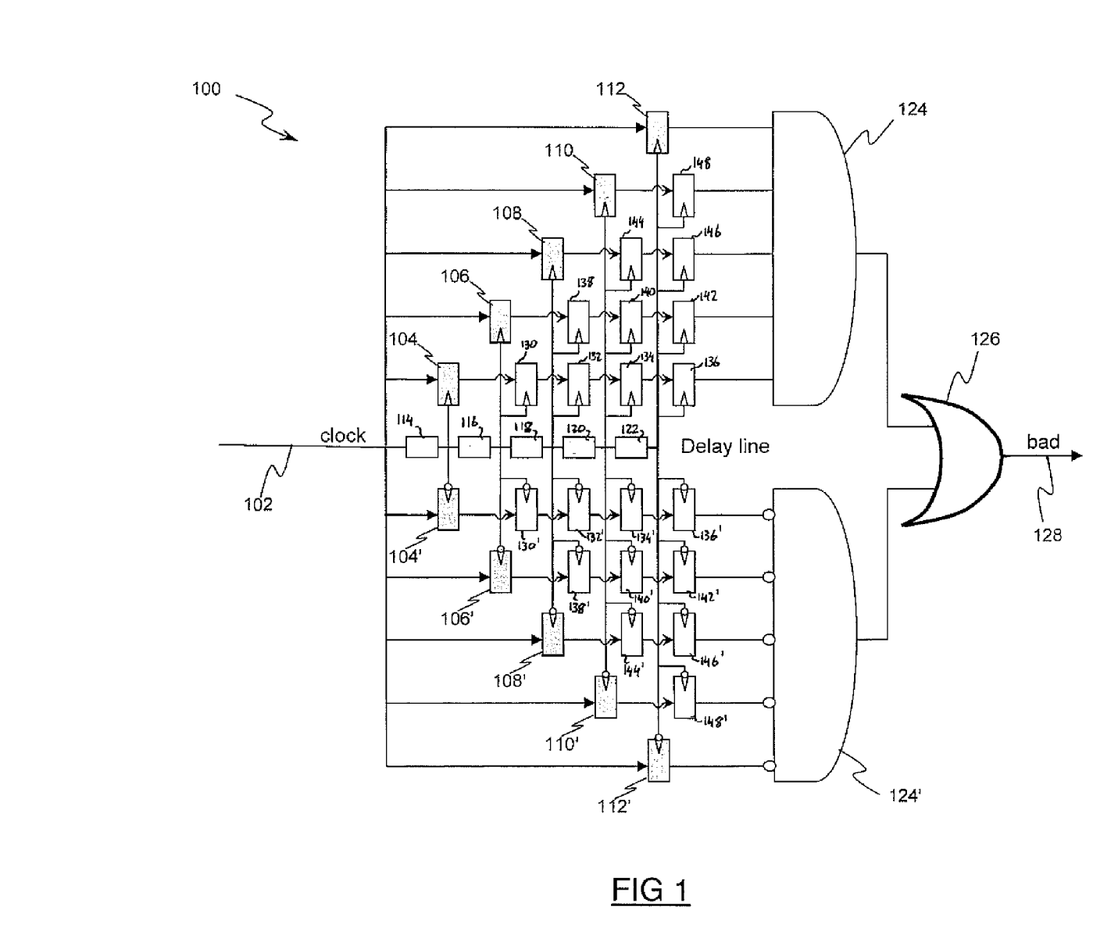
FIG. 1 is a schematic circuit diagram representing the circuit of the present invention according to a preferred embodiment.

Reference is first made to FIG. 1, which illustrates a bad clock condition detection circuit 100 according to a preferred embodiment of the present invention. The circuit 100 comprises an input line 102 which carries a clock signal. The source of the clock signal may be an off-chip crystal oscillator. The circuit 100 further comprises a first set of flip flops 104 to 112, a second set of flip flops 104' to 112', a delay line comprising delay taps 114 to 122, a first AND gate 124, a second AND gate 124', an OR gate 126 with an output on line 128, a first set of further flip flops 130 to 148 and a second set of further flips flops 130' to 148'.

The input line 102 is coupled to a data input of each of the first set of flip flops 104 to 112 and to a data input of each of the second set of flip flops 104' to 112'. The input line 102 is also coupled to an input of delay tap 114. An output of delay tap 114 is coupled to an input of delay tap 116. The output of delay tap 114 is also coupled to a clock input of flip flop 104, and via an inverter to a clock input of flip flop 104'. An output of delay tap 116 is coupled to an input of delay tap 118. The output of delay tap 116 is also coupled to respective clock inputs of flip flops 106 and 130, and via respective inverters to respective clock inputs of flip flops 106' and 130'. An output of delay tap 118 is coupled to an input of delay tap 120. The output of delay tap 118 is also coupled to respective clock inputs of flip flops 108, 132 and 138, and via respective inverters to respective clock inputs of flip flops 108', 132', and 138'. An output of delay tap 120 is coupled to an input of delay tap 122. The output of delay tap 120 is also coupled to respective clock inputs of flip flops 110, 134, 140 and 144, and via respective inverters to respective clock inputs of flip flops 110', 134', 140' and 144'. An output of delay tap 122 is coupled to respective clock inputs of flip flops 112, 136, 142, 146 and 148, and via respective inverters to respective clock inputs of flip flops 112', 136', 142', 146' and 148'.

The output of flip flop 104 is coupled to a data input of flip flop 130. The output of flip flop 130 is coupled to a data input of flip flop 132. The output of flip flop 132 is coupled to a data input of flip flop 134. The output of flip flop 134 is coupled to a data input of flip flop 136. The output of flip flop 106 is coupled to a data input of flip flop 138. The output of flip flop 138 is coupled to a data input of flip flop 140. The output of flip flop 140 is coupled to a data input of flip flop 142. The output of flip flop 108 is coupled to a data input of flip flop 144. The output of flip flop 144 is coupled to a data input of flip flop 146. The output of flip flop 110 is coupled to a data input of flip flop 148. The outputs of flip flops 136, 142, 146, 148 and 112 are coupled to inputs of AND gate 124. The output of flip flop 104' is coupled to a data input of flip flop 130'. The output of flip flop 130' is coupled to a data input of flip flop 132'. The output of flip flop 132' is coupled to a data input of flip flop 134'. The output of flip flop 134' is coupled to a data input of flip flop 136'. The output of flip flop 106' is coupled to a data input of flip flop 138'. The output of flip flop 138' is coupled to a data input of flip flop 140'. The output of flip flop 140' is coupled to a data input of flip flop 142'. The output of flip flop 108' is coupled to a data input of flip flop 144'. The output of flip flop 144' is coupled to a data input of flip flop 146'. The output of flip flop 110' is coupled to a data input of flip flop 148'. The outputs of flip flops 136', 142', 146', 148' and 112' are coupled via respective inverters to inputs of AND gate 124'. The outputs of AND gates 124 and 124' are coupled to inputs of OR gate 126.

In operation, the clock signal is an input to the circuit 100 on input line 102. The output signal on line 128 takes a high value if the clock signal has a significantly lower frequency than expected or if the clock signal has stopped, indicating that there is a "bad" clock condition on the clock signal.

The output of each delay tap (114 to 122) is a delayed version of the clock signal. The first set of flip flops 104 to 112 are controlled to sample the clock signal at respective time delays following a rising edge on the clock signal. Similarly, the second set of flip flops 104' to 112' are controlled to sample the clock signal at respective time delays following a falling edge on the clock signal.

The circuit 100 shown in FIG. 1 has a tapped delay line having five delay taps (114 to 122). The delay introduced by each delay tap and the number of delay taps in the delay line may be varied to adapt the circuit 100 for use in a particular circuit according to the normal operating conditions (e.g. normal operating temperature and voltage) of the circuit and according to the expected characteristics of the clock signal (e.g. the expected frequency, jitter and mark-space ratio) supplied to the circuit. Where the number of delay taps in the delay line is varied, the number of flip flops is varied accordingly as would be apparent to the skilled person. For example, if only 3 delay taps (e.g. 114, 116 and 118) were included in the circuit, then flip flops 110, 112, 134, 136, 140, 142, 144, 146, 148, 110', 112', 134', 136', 140', 142', 144', 146', 148' would be removed from the circuit, such that the outputs of flip flops 108, 132 and 138 are input into AND gate 124 and the outputs of flip flops 108', 132' and 138' are input via respective inverters into AND gate 124'. In this way, the number of samples of the clock signal that are taken can be varied.

Figure 2:
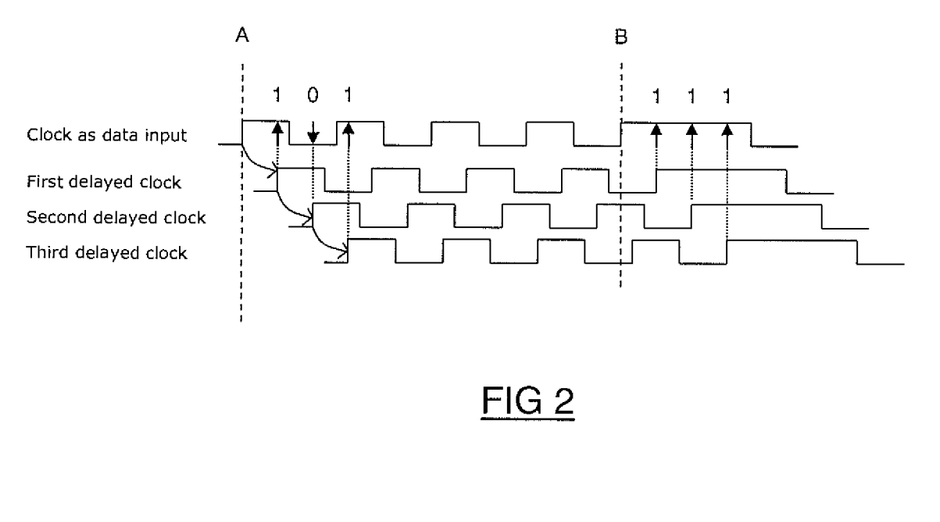
FIG. 2 is a first signal diagram showing the operation of the circuit according to a preferred embodiment.

FIG. 2 shows a signal diagram showing the clock signal and three delayed versions of the clock signal. For example, the first delayed clock may be the output of delay tap 114, the second delayed clock may be the output of delay tap 116 and the third delayed clock may be the output of delay tap 118. Following the rising edge of the clock signal labelled "A" in FIG. 2, the delayed versions of the clock will cause the flip flops 104, 106 and 108 to sample the clock signal at respective time delays, as shown with arrows in FIG. 2. In the example shown in FIG. 2, following rising edge A, the first delayed clock causes flip flop 104 to sample the clock signal before any further transitions have occurred on the clock signal, so the first sample has a high value ("1"). The second delayed clock causes flip flop 106 to sample the clock signal after a falling edge on the clock signal, so the second sample has a low value ("0"). The third delayed clock causes flip flop 108 to sample the clock signal after a further rising edge on the clock signal, so the third sample has a high value ("1"). Therefore the samples taken following rising edge A are not all high (i.e. they are not all 1s). Therefore, when these samples are input into AND gate 124, the output of the AND gate 124 is low. Unless the output of AND gate 124' is high, this results in a low signal being output from OR gate 126 on line 128 to indicate that there is not a bad clock condition on the clock signal.

However, in the example shown in FIG. 2, the frequency of the clock signal is significantly decreased following rising edge B. Following rising edge B, the first, second and third delayed clocks cause flip flops 104, 106 and 108 to sample the clock signal before any further transitions have occurred on the clock signal. Therefore the first, second and third samples all have a high value ("1"). When these samples are input into AND gate 124, the output of the AND gate 124 is high. This results in a high signal being output from OR gate 126 on line 128 to indicate that there is a bad clock condition on the clock signal.

The delays of the delayed clocks and the number of delayed clocks are chosen as described below in more detail, such that when the clock signal has an expected frequency, the samples of the clock signal taken at the respective delays do not share a common value, but when the frequency of the clock signal is significantly lower than the expected frequency then the samples of the clock signal taken at the respective delays do share a common value. In this way, the outputs of the AND gates 124 and 124' can be used to detect when the frequency of the clock signal is significantly lower than the expected frequency of the clock signal.

Figure 3A:
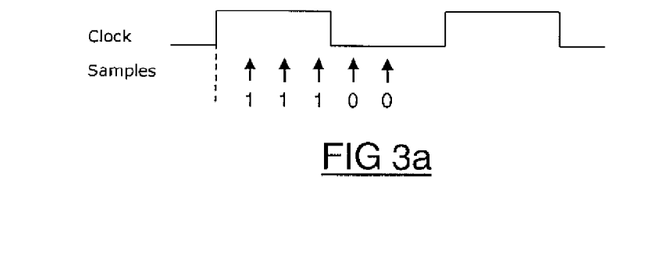
FIGS. 3a and 3b are second signal diagrams showing the operation of the circuit according to a preferred embodiment.
Figure 3B:
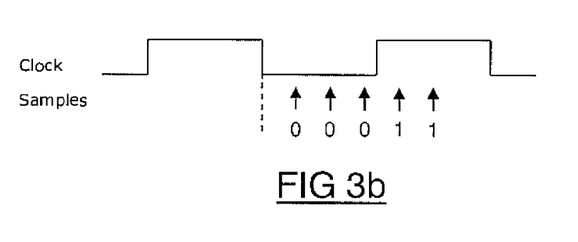

FIGS. 3*a* and 3*b* are signal diagrams showing the clock signal having an expected frequency for the circuit. FIG. 3*a* shows the samples taken by the flip flops 104, 106, 108, 110 and 112 following a rising edge on the clock signal. Flip flops 104, 106 and 108 sample the clock signal while the clock signal has a high value, whilst flip flops 110 and 112 sample the clock signal while the clock signal has a low value. Therefore the inputs into AND gate 124 are not all high and so the bad clock condition signal is not asserted on line 128.

Similarly, FIG. 3*b* shows the samples taken by the flip flops 104', 106', 108', 110' and 112' following a falling edge on the clock signal. Flip flops 104', 106' and 108' sample the clock signal while the clock signal has a low value, whilst flip flops 110' and 112' sample the clock signal while the clock signal has a high value. Therefore the inputs into AND gate 124' are not all high and so the bad clock condition signal is not asserted on line 128.

Figure 4A:
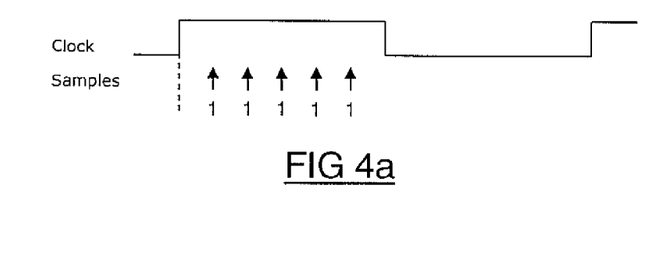
FIGS. 4a and 4b are third signal diagrams showing the operation of the circuit according to a preferred embodiment.
Figure 4B:
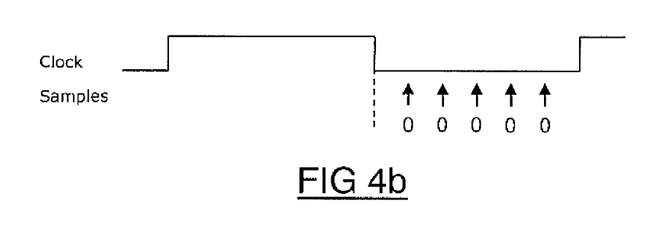

FIGS. 4*a* and 4*b* are signal diagrams showing the clock signal having a frequency which is significantly lower than the expected frequency for the circuit. FIG. 4*a* shows the samples taken by the flip flops 104, 106, 108, 110 and 112 following a rising edge on the clock signal. Each flip flop (104 to 112) samples the clock signal while the clock signal has a high value. Therefore the inputs into AND gate 124 are all high, so the bad clock condition signal is asserted on line 128.

Similarly, FIG. 4*b* shows the samples taken by the flip flops 104', 106', 108', 110' and 112' following a falling edge on the clock signal. Each flip flop (104' to 112') samples the clock signal while the clock signal has a low value. The outputs from flip flops 104' to 112' are input into AND gate 124' via respective inverters. Therefore the inputs into AND gate 124' are all high, so the bad clock condition signal is asserted on line 128.

Figure 5:
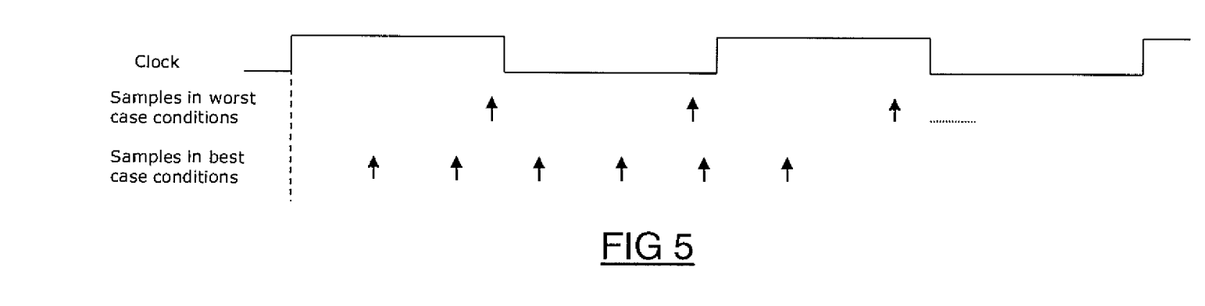
FIG. 5 is a fourth signal diagram showing the operation of the circuit according to a preferred embodiment.

With reference to FIG. 5 it is now described how the delay of each delay tap (114 to 122) and the number of delay taps in the delay line are chosen in a preferred embodiment. Each delay tap comprises a number of delay elements. Each delay element introduces a certain delay which varies according to operating conditions, such as temperature and voltage. For example, at high temperatures the delay of the delay elements may be longer than at low temperatures. The delay of each delay tap correspondingly varies according to the operating conditions. The circuit 100 is designed to operate with a clock signal having an expected frequency, jitter and mark-space ratio and to operate within a normal range of operating conditions. The normal range of operating conditions sets a normal range of delays introduced by the delay elements in the delay taps (114 to 122), such that the delay introduced by a delay element varies within a range between a minimum delay and a maximum delay when the operating conditions are varied within the normal range of operating conditions. In this specification the term "worst case conditions" means the operating conditions within the normal range of operating conditions which result in the delay elements having the maximum delay, and the term "best case conditions" means the operating conditions within the normal range of operating conditions which result in the delay elements having the minimum delay. The number of delay elements in each delay tap is chosen so that when the delay elements have the maximum delay (i.e. in the worst case conditions), the delay of each delay tap is reliably less than the minimum rise or fall time of the clock signal. FIG. 5 shows the spacing of the samples in the worst case conditions (but the number of samples in worst case conditions shown in FIG. 5 has not yet been determined. The number of samples is determined as described below once the number of delay elements in each delay tap has been determined). The clock signal shown in FIG. 5 has the expected frequency, a mark-space ratio of 1 and no jitter. It can be seen that the delay of each delay tap (and therefore the time between successive samples) in the worst case conditions is less than the minimum amount of time between transitions on the clock signal. Specifically, in FIG. 5, following a rising edge, the first sample in the worst case conditions is taken before the next falling edge of the clock signal and the second sample is taken before the next rising edge of the clock signal. This ensures that two transitions do not occur on the clock signal in the time between successive samples within the normal range of operating conditions.

If the delay of the delay taps was larger than the minimum rise or fall time of the clock signal, then it would be possible for two transitions to occur on the clock signal between successive samples. This could lead to the circuit outputting an indication that there have been no transitions on the clock signal, when there have in fact been transitions on the clock signal. Asserting the bad clock condition signal on line 128 when there is in fact no bad clock condition on the clock signal is known as a "false positive". It is important to avoid occurrences of the circuit outputting false positives where possible. It is therefore important to choose the number of delay elements in the delay taps such that in worst case conditions the delay of each delay tap is reliably less than the minimum amount of time between transitions on the clock signal.

Once the delay of each delay tap is chosen, the number of delay taps in the delay line is chosen such that in best case conditions (i.e. when the delay elements have the minimum delay) the total delay of the delay line is at least the clock period when the clock is operating at the expected frequency. The delay of each delay tap in best case conditions is shorter than that in worst case conditions, and in the example shown in FIG. 5, six delay taps are required for the delay of the most delayed sample to be taken after at least a clock period in best case conditions. Therefore in the example shown in FIG. 5, the number of delay taps in the delay line is chosen to be six.

If the number of delay taps was chosen so that the total delay of the delay line was less than the clock period in best case conditions then samples would not be taken across a whole period of the clock signal. It would therefore be possible that all of the samples would be taken before a transition on the clock signal, even when the clock signal is operating at the expected frequency. For example, if only two delay taps were used in the example shown in FIG. 5, then in the best case conditions each sample would have a high value and a false positive would be output from the circuit.

In embodiments where there is an expected jitter on the clock signal, then the number of delay taps should be chosen so that the total delay on the delay line is at least the clock period when the clock is operating at the expected frequency plus a jitter margin. In this way, even when there is jitter on the clock signal, it is ensured that samples are taken across a whole period of the clock signal.

By choosing the number of delay elements in each delay tap and the number of delay taps in the delay line as described above, when the clock is running at the expected frequency within the normal range of operating conditions at least one of flip flops 104 to 112 will be sampling the clock signal while it is still high, and at least one other of flip flops 104 to 112 will be sampling the clock signal when it has subsequently gone low. Similarly, when the clock is running at the expected frequency within the normal range of operating conditions at least one of flip flops 104' to 112' will be sampling the clock while it is still low, and at least one other of flip flops 104' to 112' will be sampling the clock signal when it has subsequently gone high.

Figure 6:
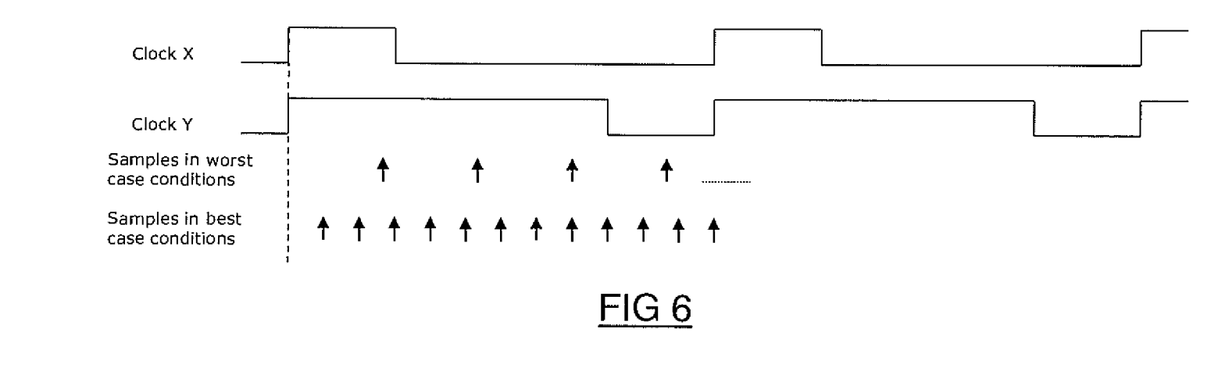
FIG. 6 is a fifth signal diagram showing the operation of the circuit according to a preferred embodiment.

The example shown in FIG. 6 illustrates how the circuit handles clock signals which have expected mark-space ratios that are not equal to 1. FIG. 6 is a signal diagram showing two clock signals (Clock X and Clock Y). Clock X has a mark-space ratio less than 1 and Clock Y has a mark-space ratio greater than 1. Specifically, the mark-space ratio of Clock X is the reciprocal of the mark-space ratio of Clock Y, whilst the period of Clock X is the same as the period of Clock Y. When these mark-space ratios are expected in the circuit 100, the number of delay elements in the delay taps is chosen as described above such that the delay of each delay tap is reliably less than the minimum rise or fall period of the clock signal in worst case conditions. As shown in FIG. 6, in worst case conditions the delay of each delay tap is shorter than the amount of time for which Clock X is high during one period and shorter than the amount of time for which Clock Y is low during one period. To ensure that the total delay of the delay line in best case conditions is at least the clock period, twelve delay taps are required in the example shown in FIG. 6.

By comparing FIGS. 5 and 6 it can be seen that if the expected mark-space ratio of the clock signal is varied away from 1, the number of delay elements in each delay tap should be reduced. Therefore the delay of each delay tap is reduced, which means that more delay taps are required to ensure that the total delay of the delay line is sufficient.

The circuit of the present disclosure may be small, comprising approximately 500 standard cells, so using the circuit will not have a detrimental affect on the rest of the computer system. The circuit of the present disclosure can detect when there has not been a transition on a clock signal for a significantly longer time period than expected. The total delay of the delay line is set to be longer than the expected amount of time between transitions on the clock signal, taking into account the expected characteristics of the clock signal and the normal operating conditions of the circuit. The circuit can be designed for specific clock signal characteristics and operating conditions as appropriate. This ensures that in the normal operating conditions the circuit will not produce false positives. If there is no transition on the clock signal for the amount of time equal to the total delay of the delay line, then the circuit determines that the clock has been "significantly slowed", and the output on line 128 is asserted. A plurality of samples of the clock signal are taken at time delays which are shorter than the total delay of the delay line to ensure that no transitions have occurred on the clock signal before the most delayed sample is taken.

Figure 7A:
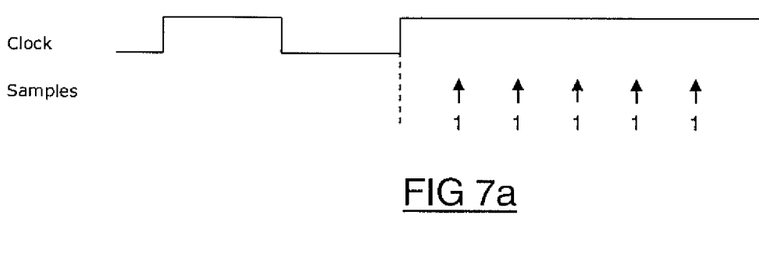
FIGS. 7a and 7b are sixth signal diagrams showing the operation of the circuit according to a preferred embodiment.

FIGS. 7a and 7b are signal diagrams illustrating how the circuit 100 handles the situation in which the clock is stopped. In FIG. 7a the clock is stopped following a rising edge. The flip flops 104, 106, 108, 110 and 112 sample the clock signal as shown in FIG. 7a, and each sample has a high value. These samples are input into the AND gate 124 such that the output of the AND gate 124 is high, resulting in the output of the OR gate 126 being high on line 128.

Figure 7B:
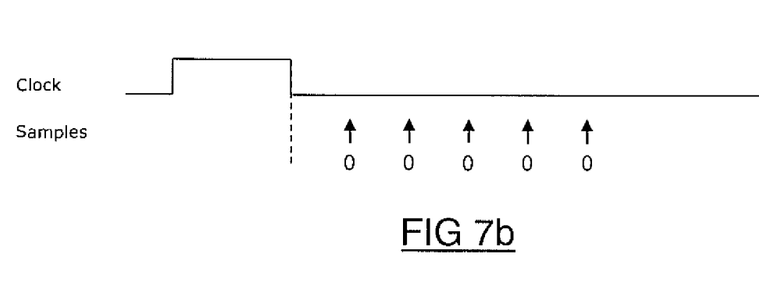

In FIG. 7b the clock is stopped following a falling edge. The flip flops 104', 106', 108', 110' and 112' sample the clock signal as shown in FIG. 7b, and each sample has a low value. These samples are input into the AND gate 124' via respective inverters such that the output of the AND gate 124' is high, resulting in the output of the OR gate 126 being high on line 128.

It is therefore shown that the circuit 100 can detect a stopped clock condition when the clock is stopped following a rising edge and when the clock is stopped following a falling edge. If the circuit 100 included only flip flops which sample the clock signal at time delays following a rising edge of the clock signal (e.g. flip flops 104 to 112, but not flip flops 104' to 112') then the stopped clock condition shown in FIG. 7b in which the clock is stopped following a falling edge of the clock signal would not be detected as a bad clock condition. Similarly, if the circuit 100 included only flip flops which sample the clock signal at time delays following a falling edge of the clock signal (e.g. flip flops 104' to 112', but not flip flops 104 to 112) then the stopped clock condition shown in FIG. 7a in which the clock is stopped following a rising edge of the clock signal would not be detected as a bad clock condition. Therefore, the circuit 100 includes both flip flops which sample the clock signal at time delays following a rising edge of the clock signal (e.g. flip flops 104 to 112) and flip flops which sample the clock signal at time delays following a falling edge of the clock signal (e.g. flip flops 104' to 112').

The further flip flops 130 to 148 and 130' to 148' are not essential to the invention, but they are included in the preferred embodiment shown in FIG. 1. The flip flops 130 to 148 are used to re-time the samples taken following a rising edge on the clock signal with flip flops 104 to 110 such that the samples taken by flip flops 104 to 112 are input into the AND gate 124 contemporaneously. This is achieved in the circuit 100 by controlling flip flops 136, 142, 146, 148 and 112 with the output of delay tap 122, such that each sample is input to the AND gate 124 from a flip flop controlled with the output of the delay tap 122 at the end of the delay line.

Similarly, the flip flops 130' to 148' are used to re-time the samples taken following a falling edge on the clock signal with flip flops 104' to 110' such that the samples taken by flip flops 104' to 112' are input into the AND gate 124' contemporaneously. This is achieved in the circuit 100 by controlling flip flops 136', 142', 146', 148' and 112' with the output of delay tap 122, such that each sample is input to the AND gate 124' from a flip flop controlled with the output of the delay tap 122' at the end of the delay line.

In this way, each sample is successively retimed by subsequent delay line taps, so that at a given instant, the samples input to an AND gate all relate to delays from the same edge of the original clock. If the re-timing flip flops (flip flops 130 to 148 and 130' to 148') were omitted, then in scenarios in which the delay of the most delayed sample is longer than the clock period plus the delay of the least delayed sample (i.e. if $D_k > T + D_l$ where $D_k$ is the delay of the most delayed sample, T is the period of the clock signal and $D_l$ is the delay of the least delayed sample), at a given instant, samples made with the nth and n+1th clock edge could be input into an AND gate at the same time, and a false positive result could occur. The introduction of the further flip flops 130 to 148 and 130' to 148' avoids the occurrence of such false positives in such scenarios.

Figure 8:
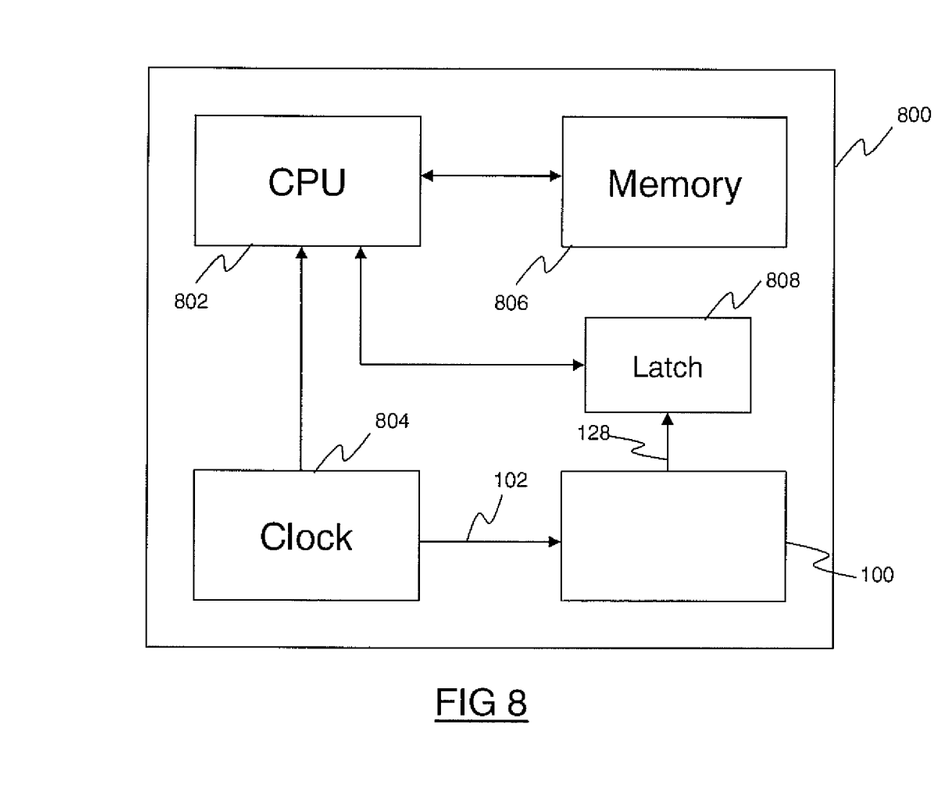
FIG. 8 is a representation of a computer system including the circuit according to a preferred embodiment.

With reference to FIG. 8 there is now described a computer system according to a preferred embodiment. Computer system 800 comprises a CPU 802, a clock 804, a memory 806, a latch 808 and the circuit 100 as described herein above. The clock 804 provides clock signals to the CPU 802, wherein the timing of operations performed by the CPU 802 is controlled with the clock signals provided from clock 804. Some operations executed on the CPU 802 may cause the CPU 802 to read or write to the memory 806. The clock 804 may reside on the same chip as the CPU 802. Alternatively, the clock 804 may be external to the chip on which the CPU 802 resides.

The clock signal is provided from the clock 804 to the circuit 100 on line 102. As described herein above, if there exists a bad clock condition on the clock signal then the output signal from circuit 100 on line 128 is asserted. Conversely, if a bad clock condition does not exist on the clock signal then the output signal from circuit 100 on line 128 is not asserted. The output of circuit 100 on line 128 is input into the latch 808. If the signal on line 128 is asserted then the latch 808 will store a value indicating that a bad clock condition has been detected on the clock signal. The CPU 802 is coupled to the latch 808 so that the CPU can determine whether the latch is currently storing the indication that a bad clock condition has been detected on the clock signal. In preferred embodiments, the latch stores the indication as a "sticky bit" such that this bit is set when the signal on line 128 is asserted but it is not reset due to the signal on line 128 subsequently becoming not asserted. In this way, the sticky bit in the latch 808 can be used to indicate whether the clock has at some point been significantly slowed or stopped, even if the bad clock condition no longer exists on the clock signal. The sticky bit in the latch 808 can be reset with an instruction sent from the CPU 802. In this way the sticky bit in the latch 808 has hysteresis properties such that the value of the sticky bit at a particular point in time depends upon the history of the circuit.

In alternative embodiments, the latch 808 does not store the indication as a sticky bit. When the signal is asserted on line 128 the latch 808 stores a value indicating that a bad clock condition has been detected on the clock signal, but when the signal becomes not asserted on line 128 the latch 808 no longer stores an indication that a bad clock condition has been detected on the clock signal. In these embodiments, the value stored in the latch does not depend upon the history of the circuit.

The CPU 802 can read the value stored in the latch 808 in order to determine whether a bad clock condition has occurred on the clock signal. If the latch 808 indicates that no bad clock condition has occurred on the clock signal then the CPU will process operations as normal, using the clock signal from clock 804. However, if the latch 808 indicates to the CPU 802 that a bad clock condition has occurred on the clock signal then the CPU can take remedial action to prevent malfunctions caused by the bad clock condition on the clock signal from the clock 804. Some remedial action may be taken without involving the CPU 802, for example the latch 808 may be used to automatically reset the system 800.

The circuit 100 detects a significant slowing or stopping of the clock signal and indicates this to the CPU. This indication may be via the latch 808 as shown in FIG. 8, or alternatively, the circuit 100 may send the indication on line 128 directly to the CPU. The remedial action taken by the CPU 802 may include for example stopping all operations, performing a system reset and/or switching to an alternative clock.

It will be appreciated that the above embodiments are described only by way of example. Other applications and configurations may be apparent to the person skilled in the art given the disclosure herein. The scope of the invention is not limited by the described embodiments, but only by the following claims.

It may be advantageous to set forth definitions of certain words and phrases used in this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method of detecting a bad clock condition on a clock signal, the method comprising:
sampling a value of the clock signal at a first plurality of time delays timed following a rising edge on the clock signal to encompass a transition in the clock signal, such that a respective first plurality of samples are produced;
determining whether all of the first plurality of samples have a first logic state;
sampling a value of the clock signal at a second plurality of time delays timed following a falling edge on the clock signal to encompass a transition in the clock signal, such that a respective second plurality of samples are produced;
determining whether all of the second plurality of samples have a second logic state; and
determining that the bad clock condition exists on the clock signal if at least one of the following conditions is met: all of the first plurality of samples have the first logic state, and all of the second plurality of samples have the second logic state.

2. A method of detecting a bad clock condition on a clock signal, the method comprising:
sampling a value of the clock signal at a first plurality of time delays following a rising edge on the clock signal, such that a respective first plurality of samples are produced;
determining whether all of the first plurality of samples have a first logic state;
sampling a value of the clock signal at a second plurality of time delays following a falling edge on the clock signal, such that a respective second plurality of samples are produced;
determining whether all of the second plurality of samples have a second logic state; and
determining that the bad clock condition exists on the clock signal if at least one of the following conditions is met: all of the first plurality of samples have the first logic state, and all of the second plurality of samples have the second logic state,
wherein the first plurality of samples are produced using a respective first plurality of flip flops which are controlled with a respective first plurality of delayed versions of the clock signal to sample the value of the clock signal at the first plurality of time delays, wherein the second plurality of samples are produced using a respective second plurality of flip flops which are controlled with a respective second plurality of delayed versions of the clock signal to sample the value of the clock signal at the second plurality of time delays, and wherein each flip flop of the first and second pluralities of flip flops receives the clock signal as a data input.

3. The method of claim 2, wherein the second plurality of delayed versions of the clock signal are inversions of the first plurality of delayed versions of the clock signal.

4. The method of claim 2, further comprising feeding the clock signal into a tapped delay line comprising a plurality of delay taps, wherein the first and second pluralities of delayed versions of the clock signal are output from respective delay taps of the tapped delay line.

5. The method claim 2 wherein the first plurality of time delays are equal to the second plurality of time delays.

6. The method of claim 2, wherein determining whether all of the first plurality of samples have the first logic state further comprises performing a first AND operation on the first plurality of samples, and wherein determining whether all of the second plurality of samples have the second logic state further comprises performing a second AND operation on the second plurality of samples.

7. The method of claim 6, wherein the second plurality of samples are inverted before performing the second AND operation.

8. The method of claim 6, wherein determining that the bad clock condition exists on the clock signal further comprises: performing an OR operation on the results of the first and second AND operations.

9. The method of claim 6, further comprising: in response to a determination that the bad clock condition exists on the clock signal, asserting an output signal.

10. The method of claim 9, further comprising:

retiming the first plurality of samples so that each of the first plurality of samples experiences a first total delay; and retiming the second plurality of samples so that each of the second plurality of samples experiences a second total delay.

11. A circuit for detecting a bad clock condition on a clock signal, the circuit comprising:

a first sampling unit configured to sample a value of the clock signal at a first plurality of time delays timed following a rising edge on the clock signal to encompass a transition in the clock signal, such that a respective first plurality of samples are produced;

a first determining unit configured to determine whether all of the first plurality of samples have a first logic state;

a second sampling unit configured to sample a value of the clock signal at a second plurality of time delays timed following a falling edge on the clock signal to encompass a transition in the clock signal, such that a respective second plurality of samples are produced;

a second determining unit configured to determine whether all of the second plurality of samples have a second logic state; and a third determining unit configured to determine that the bad clock condition exists on the clock signal if at least one of the following conditions is met: all of the first plurality of samples have the first logic state, and all of the second plurality of samples have the second logic state.

12. A circuit for detecting a bad clock condition on a clock signal, the circuit comprising:

a first sampling unit configured to sample a value of the clock signal at a first plurality of time delays spaced following a rising edge on the clock signal to encompass a transition in the clock signal, such that a respective first plurality of samples are produced;

a first determining unit configured to determine whether all of the first plurality of samples have a first logic state;

a second sampling unit configured to sample a value of the clock signal at a second plurality of time delays timed following a falling edge on the clock signal to encompass a transition in the clock signal, such that a respective second plurality of samples are produced;

a second determining unit configured to determine whether all of the second plurality of samples have a second logic state; and a third determining unit configured to determine that the bad clock condition exists on the clock signal if at least one of the following conditions is met: all of the first plurality of samples have the first logic state, and all of the second plurality of samples have the second logic state, wherein the first sampling unit comprises a first plurality of flip flops configured to be controllable with a respective first plurality of delayed versions of the clock signal to sample the value of the clock signal at the first plurality of time delays, wherein the second sampling unit comprises a second plurality of flip flops configured to be controllable with a respective second plurality of delayed versions of the clock signal to sample the value of the clock signal at the second plurality of time delays, and wherein each flip flop of the first and second pluralities of flip flops is configured to receive the clock signal as a data input.

13. The circuit of claim 12, further comprising:

at least one first sequence of further flip flops configured to receive a respective at least one of the first plurality of samples and configured to be controlled with subsequent ones of the first plurality of delayed versions of the clock signal, such that each of the first plurality of samples is output to the first determining means from a flip flop being controlled with the most delayed of the first plurality of delayed versions of the clock signal; and at least one second sequence of further flip flops configured to receive a respective at least one of the second plurality of samples and configured to be controlled with subsequent ones of the second plurality of delayed versions of the clock signal, such that each of the second plurality of samples is output to the second determining means from a flip flop being controlled with the most delayed of the second plurality of delayed versions of the clock signal.

14. The circuit of claim 12, further comprising a tapped delay line comprising a plurality of delay taps, the tapped delay line configured to receive the clock signal and to output the first and second pluralities of delayed versions of the clock signal from respective delay taps of the tapped delay line.

15. The circuit of claim 14, wherein each delay tap in the tapped delay line comprises a predetermined number of delay elements, wherein the number of delay elements in each delay tap determines the time delay introduced by the delay tap, wherein the delay of each delay element varies according to operating conditions such that within a normal range of operating conditions for the circuit there is a maximum delay and a minimum delay of each delay element.

16. The circuit of claim 15, wherein the number of delay elements in each delay tap is chosen so that when the delay elements have the maximum delay, the delay introduced by each delay tap is shorter than the minimum amount of time between transitions on the clock signal.

17. The circuit of claim 15, wherein the number of delay taps in the tapped delay line is selected so that when the delay elements have the minimum delay, the total delay of the tapped delay line is at least the period of the clock signal.

18. The circuit of claim 12, wherein the first determining unit comprises a first AND gate, the second determining unit comprises a second AND gate and the third determining comprises an OR gate, wherein the output of the first and second AND gates are inputs to the OR gate.

19. A computer system for processing data using a clock signal, the computer system comprising:
   a circuit configured to detect a bad clock condition on the clock signal, the circuit comprising:
      a first sampling unit configured to sample a value of the clock signal at a first plurality of time delays timed following a rising edge on the clock signal to encompass a clock transition, such that a respective first plurality of samples are produced;
      a first determining unit configured to determine whether all of the first plurality of samples have a first logic state;
      a second sampling unit configured to sample a value of the clock signal at a second plurality of time delays timed following a falling edge on the clock signal to encompass a clock transition, such that a respective second plurality of samples are produced;
      a second determining unit configured to determine whether all of the second plurality of samples have a second logic state; and
      a third determining unit configured to determine that the bad clock condition exists on the clock signal if at least one of the following conditions is met: it is determined that all of the first plurality of samples have the first logic state, and it is determined that all of the second plurality of samples have the second logic state.

20. The computer system of claim 19, further comprising: a sticky bit which is set if it is determined that the bad clock condition exists on the clock signal.

\* \* \* \* \*